(12) United States Patent
Dutartre

(10) Patent No.: US 9,312,408 B2
(45) Date of Patent: Apr. 12, 2016

(54) IMAGER HAVING A REDUCED DARK CURRENT THROUGH AN INCREASED BULK DOPING LEVEL

(71) Applicant: STMicroelectronics SA, Montrouge (FR)

(72) Inventor: Didier Dutartre, Meylan (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/738,529

(22) Filed: Jun. 12, 2015

(65) Prior Publication Data

US 2015/0364520 A1 Dec. 17, 2015

(30) Foreign Application Priority Data

Jun. 12, 2014 (FR) ...................... 14 55335

(51) Int. Cl.
*H01L 31/0232* (2014.01)
*H01L 27/146* (2006.01)
*H01L 31/0352* (2006.01)
*H01L 31/042* (2014.01)

(52) U.S. Cl.
CPC ...... *H01L 31/02327* (2013.01); *H01L 27/1461* (2013.01); *H01L 27/1463* (2013.01); *H01L 27/14621* (2013.01); *H01L 27/14627* (2013.01); *H01L 27/14645* (2013.01); *H01L 27/14689* (2013.01); *H01L 31/0232* (2013.01); *H01L 31/0352* (2013.01); *H01L 31/042* (2013.01)

(58) Field of Classification Search
CPC .................... H01L 31/0232; H01L 31/02327; H01L 31/0352; H01L 31/042; H01L 31/0524; H01L 31/10
See application file for complete search history.

(56) References Cited

U.S. PATENT DOCUMENTS

| 6,504,196 | B1 | 1/2003 | Rhodes | |
|---|---|---|---|---|
| 2002/0125541 | A1* | 9/2002 | Korec et al. | 257/471 |
| 2005/0007323 | A1* | 1/2005 | Appelbaum et al. | 345/87 |
| 2006/0138577 | A1* | 6/2006 | Hashimoto | 257/432 |
| 2006/0186560 | A1 | 8/2006 | Swain et al. | |
| 2006/0237746 | A1* | 10/2006 | Orlowski et al. | 257/192 |
| 2008/0079045 | A1 | 4/2008 | Bahl et al. | |
| 2008/0178932 | A1* | 7/2008 | Den Boer et al. | 136/256 |
| 2009/0283807 | A1* | 11/2009 | Adkisson et al. | 257/292 |
| 2009/0294811 | A1* | 12/2009 | Rhodes et al. | 257/292 |
| 2010/0140675 | A1 | 6/2010 | Rhodes | |
| 2010/0144084 | A1* | 6/2010 | Doan et al. | 438/72 |
| 2011/0053305 | A1 | 3/2011 | Kanbe | |
| 2013/0341693 | A1* | 12/2013 | Yamaguchi | 257/292 |
| 2014/0002700 | A1* | 1/2014 | Oishi | 348/273 |
| 2014/0131829 | A1* | 5/2014 | Tsao | 257/499 |

* cited by examiner

*Primary Examiner* — Eduardo A Rodela
(74) *Attorney, Agent, or Firm* — Seed IP Law Group PLLC

(57) ABSTRACT

The disclosure relates to an image sensor comprising a substrate region in a semiconductor material; an active layer in contact with the substrate region; and a photodiode array formed in the active layer. The substrate region has a doping level such that the resistivity of the substrate region is less than 6 mOhm·cm.

12 Claims, 1 Drawing Sheet

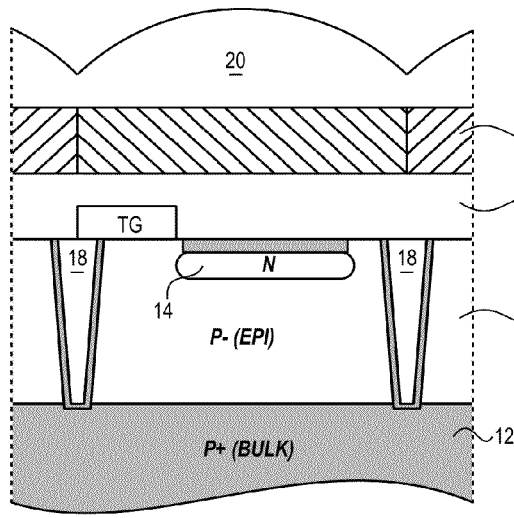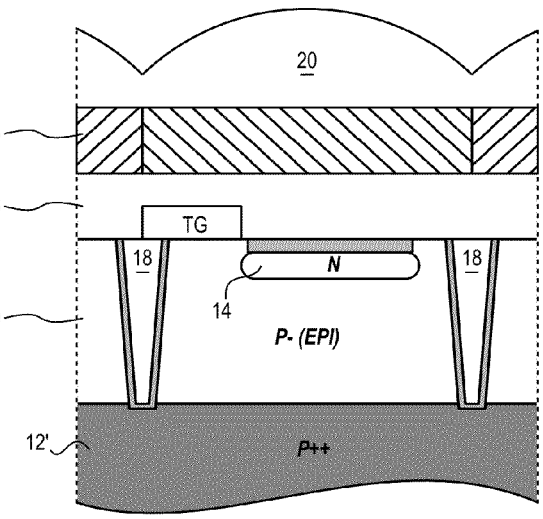
Fig 1               Fig 2
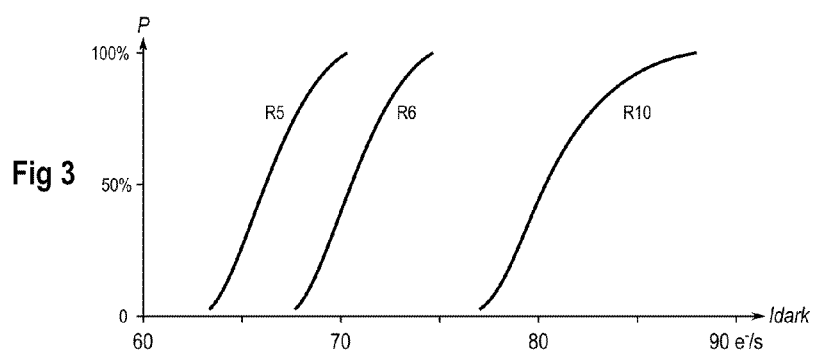
Fig 3
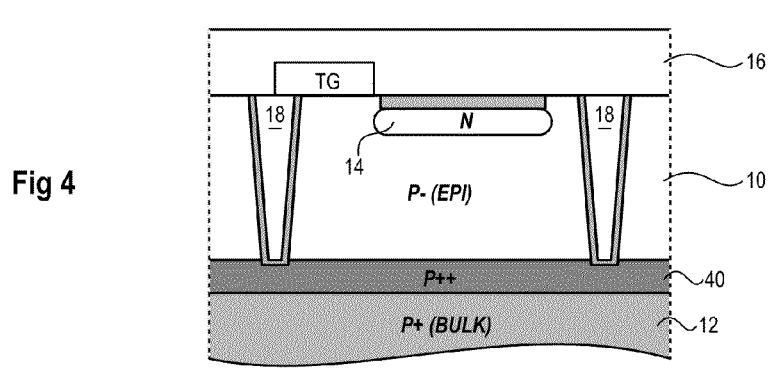
Fig 4

IMAGER HAVING A REDUCED DARK CURRENT THROUGH AN INCREASED BULK DOPING LEVEL

BACKGROUND

1. Technical Field

The disclosure relates to image sensors or imagers in CMOS technology.

2. Description of the Related Art

FIG. 1 is a schematic sectional view of a pixel of a CMOS image sensor. In this figure and the following, the different pixel elements are shown with dimensions chosen to make the figures intelligible and are not drawn to scale. The doping levels of the P-conductivity type zones are shown with shades of gray that are all the darker as the doping levels increase.

The image sensor is formed in an active layer 10, usually of P conductivity type, having a doping level noted P−. The layer 10 is formed on a substrate 12, often of P− conductivity type. The doping level of the substrate, denoted by P+, is generally much higher than the doping level of the active layer 10, typically 3 decades. The layer 10 may have a thickness between 3 and 6 microns, while the substrate may have a thickness of 780 microns.

A buried layer 14 of N-conductivity type, close to the upper face of the layer 10, forms a photodiode with the layer 10. As shown, the portion of the layer 10 above the zone 14 may have a higher doping level than the layer 10 to provide a passivation of the top interface. The upper surface of the layer 10 bears various conductive zones for controlling the pixel, including a transfer gate TG. These conductive zones and other metal tracks may be embedded in a passivation layer 16.

The pixel may be laterally isolated from its neighboring pixels by trench isolators 18, typically including semiconductor oxide, which extend throughout the thickness of the active layer 10. Alternatively, the insulation between the pixels may be achieved by an over-doping (P-type) relative to the layer 10, but such insulation is known to be less effective from both an electrical and an optical point of view. The spacing between the trench isolators 18 defines the size of the pixels.

In the case of a color sensor, individual color filters 19 are attached to the layer 16 in correspondence with the pixels. The filters 19 usually bear individual collimating lenses 20.

In operation, during an integration phase, the photodiode 10/14 is floating and photons absorbed by the active layer generate electrons that are stored in the zone 14. At the end of the integration phase, the stored charge represents the amount of light received by the pixel.

A recurring problem with this pixel structure is that electrons reach into the active layer 10 even in the absence of light, producing a so-called dark current. The dark current being different between pixels, or from one integration phase to another, the image captured by the sensor has exposure differences from one pixel to the other, even if the pixels have received the same amount of light. This phenomenon produces a visible noise in images captured in low light conditions.

The origins of dark current are not well known. An identified origin is the presence of imperfections or impurities in the active layer that promote the generation of electrons that diffuse towards the junction of the photodiode.

To limit this phenomenon, interfaces that may present a poor surface state are neutralized, such as the interface between the trench isolators 18 and the layer 10. As shown, a P-type layer having a higher doping level than the active layer 10 may line the trench isolators 18. The doping level may be the same, P+, as the substrate. Thus, the generation centers are less active and there are fewer electrons that may diffuse to the zone 14.

Despite these measures, a dark current remains.

BRIEF SUMMARY

An image sensor is provided, comprising a substrate region in a semiconductor material; an active layer in contact with the substrate region; and an array of photodiodes formed in the active layer. The substrate region has a doping level such that the resistivity of the substrate region is less than 6 mOhm·cm.

The sensor may comprise a substrate having a doping level greater than that of the active layer; and an intermediate layer forming said substrate region, having a doping level greater than the substrate.

The intermediate layer may be epitaxial and have a resistivity between 1 and 6 mOhm·cm.

The intermediate layer may have a thickness between 1 and 10 microns.

The substrate region may be an integral part of a substrate having a uniform doping level.

The sensor may comprise a passivation layer on the active layer; an array of colored filters on the passivation layer; and an array of collimating lenses on the filter array.

A method may also be provided for manufacturing an image sensor, comprising the steps of forming on a semiconductor substrate an intermediate layer having a doping level higher than that of the substrate; forming on the intermediate layer an active layer having a doping level lower than that of the substrate; and forming an array of photodiodes in the active layer.

The doping level of the intermediate layer may be such that the resistivity of the intermediate layer is less than 6 mOhm·cm.

The active layer and the intermediate layer may be formed by epitaxial growth.

BRIEF DESCRIPTION OF THE SEVERAL VIEWS OF THE DRAWINGS

Other potential advantages and features of various embodiments will become more clearly apparent from the following description of particular embodiments provided for exemplary purposes only and represented in the appended drawings, in which:

FIG. 1, previously described, is a schematic sectional view of a pixel of a CMOS image sensor;

FIG. 2 is a schematic sectional view of an embodiment of a low dark current pixel;

FIG. 3 is a graph comparing the dark currents measured on several samples of pixels of the type of FIG. 1 and pixels of the type of FIG. 2; and FIG. 4 is a schematic sectional view of another embodiment of a low dark current pixel.

DETAILED DESCRIPTION

The inventor has studied the assumption that the substrate may be a source of electrons contributing to the dark current. Indeed, although the substrate is p-doped, that is to say that the majority carriers are positive, there are still electrons according to the relationship $N_p N_n = n_i^2$, where $N_p$ and $N_n$ are the numbers of positive and negative carriers, respectively, and $n_i$ is the intrinsic concentration of the semiconductor material at a given temperature. These negative carriers or electrons could under certain conditions migrate from the substrate to the active layer, even if the P-doping level of the active layer is lower than that of the substrate.

Under this assumption, the contribution of the substrate to the dark current could be reduced by increasing the doping level of the substrate, which would have the effect of reducing the concentration of electrons in the substrate.

FIG. 2 illustrates an image sensor pixel exploiting this principle. The pixel may be identical in all respects to that of FIG. 1, except that the substrate, here designated 12', is selected with a doping level P++ higher than that of a conventional sensor.

In a first phase, the inventor sought to validate this assumption by testing substrates cut from commercially available silicon ingots.

Silicon ingots used to produce substrates for CMOS components are generally P-doped according to specifications allowing a wide margin of doping levels, typically between $4 \cdot 10^{18}$ and $1.5 \cdot 10^{19}$ dopant atoms per $cm^3$. The dopant used is usually boron. Rather than speaking of numbers of dopant atoms, it is preferred to speak of resistivity of the material, which is an equivalent and easily measurable physical quantity. The equivalent margin in terms of resistivity is 6 to 15 mOhm·cm, the lower resistivity values corresponding to the higher doping levels.

Ingot manufacturers thus aim for a typical resistivity of 10 mOhm·cm. A small volume of the ingots comes out with a resistivity at the limits of the margin. Often sections of these ingots are considered "off-spec" by the semiconductor manufacturers and are discarded, especially for the lower resistivity ingots.

It is these lower resistivity ingots that were tested here.

FIG. 3 is a graph summarizing the results of tests for several substrate doping levels. Each doping level was implemented in individual wafers with hundreds of 3.75-micron pixel arrays in a 3-micron active layer. The average dark current per array was measured on each wafer. The curves shown in FIG. 3 are the distribution functions of the measured currents. The dark current Idark is expressed in electrons per second. Curve R10 represents the measurements performed on pixel arrays made on a typical substrate of 10 mOhm·cm. Average dark currents per array having a median of approximately 80 electrons per second were observed.

Curves R6 and R5 represent the measurements achieved on arrays made in more heavily doped substrates, having resistivity values of respectively 6 and 5 mOhm·cm. Median dark currents of about 71 and 66 electrons per second are obtained, respectively. Thus, the dark current decreases by 14 electrons per second when the resistivity of the substrate decreases from 10 to 5 mOhm·cm.

These results clearly show a correlation between the resistivity (or doping level) of the substrate and the dark current, and suggest the possibility of further reducing the dark current by further increasing the doping level of the substrate.

The lower resistivity limit of commercially available ingots, however, was established to avoid the risk of defects in the active layer. Indeed, the boron or other dopant atoms substitute for silicon atoms in the semiconductor crystal lattice. The boron atoms being smaller than silicon atoms, the average lattice size decreases as the doping level increases. The active layer may be formed by epitaxial growth on the substrate, so that there is a crystallographic continuity between the substrate and the active layer. The substrate being substantially thicker than the active layer (by a factor of about 200), it imposes the lattice size to the active layer. The doping level of the active layer being smaller than that of the substrate, the active layer is subjected to compressive stress. The resistivity of the active layer 10 may be between 2 and 20 Ohm·cm, that is to say, it is 1000 times greater than the resistivity of the substrate. If the stress becomes too high, the active layer may undergo an irreversible plastic deformation, which is characterized by the occurrence of crystal defects (lattice mismatch dislocations) that are not acceptable in an electronic device such as a pixel. It is to avoid the risk of defects in the active layer that semiconductor manufacturers tend to refuse ingots in the lower resistivity range.

FIG. 4 is a schematic sectional view of an embodiment of a pixel that reduces the risk of crystal defects in the active layer while the doping level of the substrate may be increased.

In practice, it is not useful to heavily dope the entire substrate. The risk of extraction of electrons from the substrate to the active layer is limited to a depth of a few microns. It is then sufficient that the substrate be more heavily doped in a region 40 at the interface between the substrate and the active layer, the remainder of the substrate 12 having a typical doping level.

In practice, the region 40 may be a layer formed by epitaxial growth on the substrate. The active layer 10 may then be formed by epitaxial growth on the layer 40. The thickness of the layer 40 may range from 1 to 10 microns, while the thickness of the active layer 10 may remain at a typical value from 3 to 6 microns.

With this configuration, the substrate imposes its crystal lattice size to layers 40 and 10. The layer 10 is subjected to the same compressive stress as in a conventional pixel, while the layer 40 is moderately subjected to tensile stress (since the difference between the doping levels of the layer 40 and the substrate, which imposes the lattice size, is smaller than between the layer 40 and the active layer 10).

With this structure, a resistivity of less than 5 mOhm·cm, for example 1 mOhm·cm, may be considered for layer 40 without risking a failure.

The measurements illustrated by the curves of FIG. 3 were performed on pixels that have a cubic form factor (3×3.75 microns). In such a pixel configuration, the fraction per pixel of the active layer in contact with the substrate is relatively low. Presumably, the increased doping level of the substrate will have a more pronounced effect in larger pixels, where the fraction of the active layer in contact with the substrate is more significant.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor comprising:
   a substrate region in a semiconductor material having a doping level such that the substrate region has a resistivity that is less than 6 mOhm·cm;
   an active layer in the semiconductor material and in contact with the substrate region;
   an array of photodiodes formed in the active layer;
   deep trench isolators in contact with the substrate region and structured to isolate the photodiodes from each other; and
   a semiconductor layer lining the trench isolators, in contact with the substrate region and having a higher doping level than the active layer.

2. The sensor of claim 1, comprising:
a substrate having a doping level greater than that of the active layer; wherein said substrate region has a doping level greater than the doping level of the substrate and is an intermediate layer positioned between the substrate and the active layer.

3. The sensor of claim 2, wherein the intermediate layer is epitaxial and has a resistivity between 1 and 6 mOhm·cm.

4. The sensor of claim 2, wherein the intermediate layer has a thickness between 1 and 10 microns.

5. The sensor of claim 1, wherein the substrate region is an integral part of a substrate having a uniform doping level.

6. The sensor of claim 1, comprising:
a passivation layer on the active layer;
an array of colored filters on the passivation layer; and
an array of collimating lenses on the array of colored filters.

7. A method of manufacturing an image sensor, the method comprising:
forming a substrate region in a semiconductor material, the substrate region having a doping level such that the substrate region has a resistivity that is less than 6 mOhm·cm;
forming an active layer in the semiconductor material and in contact with the substrate region;
forming an array of photodiodes formed in the active layer;
forming deep trench isolators in contact with the substrate region and structured to isolate the photodiodes from each other; and
forming a semiconductor layer lining the trench isolators, in contact with the substrate region and having a higher doping level than the active layer.

8. The method of claim 7, wherein:
said substrate region has a doping level greater than the doping level of the substrate and is an intermediate layer positioned between a substrate and the active layer, the substrate having a doping level greater than that of the active layer.

9. The method of claim 8, wherein forming the substrate region includes epitaxially growing the substrate region, the substrate region having a resistivity between 1 and 6 mOhm·cm.

10. The method of claim 8, wherein the intermediate layer has a thickness between 1 and 10 microns.

11. The method of claim 7, wherein the substrate region is an integral part of a substrate having a uniform doping level.

12. The method of claim 7, comprising:
forming a passivation layer on the active layer;
forming an array of colored filters on the passivation layer; and
forming an array of collimating lenses on the array of colored filters.

* * * * *